(12) United States Patent
Behrens et al.

(10) Patent No.: US 8,653,363 B2
(45) Date of Patent: Feb. 18, 2014

(54) MAGNETIC FILLER PANEL FOR USE IN AIRFLOW CONTROL SYSTEM IN ELECTRONIC EQUIPMENT ENCLOSURE

(75) Inventors: Edward Behrens, Hopkinton, MA (US); Dennis W. Vanlith, Round Rock, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 298 days.

(21) Appl. No.: 13/117,977

(22) Filed: May 27, 2011

(65) Prior Publication Data

US 2011/0290553 A1  Dec. 1, 2011

Related U.S. Application Data

(60) Provisional application No. 61/350,128, filed on Jun. 1, 2010.

(51) Int. Cl.
*H05K 5/00* (2006.01)
*H05K 7/20* (2006.01)

(52) U.S. Cl.
USPC .... 174/50; 174/17 VA; 174/547; 361/679.46; 361/688; 312/223.1

(58) Field of Classification Search
USPC ............... 174/480, 481, 50, 53, 57, 58, 17 R, 174/17 VA, 500, 503, 495, 560, 562, 529, 174/547, 559; 220/3.2–3.9, 4.02; 361/600, 361/601, 641, 644, 657, 659, 679.01, 361/679.46, 679.5, 688, 694, 724, 728, 790, 361/752, 796, 797, 799; 211/26; 312/223.1, 312/223.3, 223.6, 265.1, 265.2, 265.4, 312/265.5, 265.6; 428/99, 98

See application file for complete search history.

(56) References Cited

U.S. PATENT DOCUMENTS

| | | | |
|---|---|---|---|
| 3,192,306 A | 6/1965 | Skonnord |
| 3,364,838 A | 1/1968 | Bradley |
| 3,404,931 A | 10/1968 | Fall et al. |
| 3,563,627 A | 2/1971 | Whipps |
| 4,467,584 A | 8/1984 | Crites et al. |
| 4,495,545 A | 1/1985 | Dufresne et al. |
| 4,541,219 A | 9/1985 | Parker |
| 4,592,602 A | 6/1986 | Kuster et al. |
| 4,774,631 A | 9/1988 | Okuyama et al. |

(Continued)

FOREIGN PATENT DOCUMENTS

| | | |
|---|---|---|
| AU | 2008254682 | 11/2012 |
| DE | 2509487 A1 | 9/1976 |

(Continued)

OTHER PUBLICATIONS

Information Disclosure Statement (IDS) Letter Regarding Common Patent Application(s), dated May 5, 2012.

(Continued)

*Primary Examiner* — Angel R Estrada
(74) *Attorney, Agent, or Firm* — Tillman Wright, PLLC; James D. Wright; David R. Higgins

(57) ABSTRACT

An electronic equipment enclosure system with an airflow control system includes an enclosure, having a front, a rear, a top, a bottom and two sides, and a magnetic filler panel.

20 Claims, 13 Drawing Sheets

(56) References Cited

U.S. PATENT DOCUMENTS

| | | |
|---|---|---|
| 5,165,770 A | 11/1992 | Hahn |
| 5,216,579 A | 6/1993 | Basara et al. |
| 5,250,752 A | 10/1993 | Cutright |
| 5,294,748 A | 3/1994 | Schwenk et al. |
| 5,460,441 A | 10/1995 | Hastings et al. |
| 5,528,454 A | 6/1996 | Niklos |
| 5,544,012 A | 8/1996 | Koike |
| 5,570,740 A | 11/1996 | Flores et al. |
| 5,639,150 A | 6/1997 | Anderson et al. |
| 5,671,805 A | 9/1997 | Stahl et al. |
| 5,695,263 A | 12/1997 | Simon et al. |
| 5,721,394 A * | 2/1998 | Mulks ............ 174/58 |
| 5,791,498 A | 8/1998 | Mills |
| 5,798,485 A | 8/1998 | Rohde et al. |
| 5,806,945 A | 9/1998 | Anderson et al. |
| 5,806,946 A | 9/1998 | Benner et al. |
| 5,851,143 A | 12/1998 | Hamid |
| 5,901,033 A | 5/1999 | Crawford et al. |
| 5,941,767 A | 8/1999 | Fukuda |
| 5,995,368 A | 11/1999 | Lee et al. |
| 5,997,117 A | 12/1999 | Krietzman |
| 6,034,873 A | 3/2000 | Stahl et al. |
| 6,036,290 A | 3/2000 | Jancsek et al. |
| 6,044,193 A | 3/2000 | Szentesi et al. |
| 6,067,233 A | 5/2000 | English et al. |
| 6,104,003 A | 8/2000 | Jones |
| 6,123,400 A | 9/2000 | Nicolai et al. |
| D432,098 S | 10/2000 | Nelson et al. |
| 6,127,663 A | 10/2000 | Jones |
| 6,163,454 A | 12/2000 | Strickler |
| 6,185,098 B1 | 2/2001 | Benavides |
| 6,198,628 B1 | 3/2001 | Smith |
| 6,222,729 B1 | 4/2001 | Yoshikawa |
| 6,364,374 B1 | 4/2002 | Noone et al. |
| 6,373,721 B2 | 4/2002 | Lecinski et al. |
| 6,381,147 B1 | 4/2002 | Hayward et al. |
| 6,384,323 B2 * | 5/2002 | Elm et al. ............ 361/799 |
| 6,459,579 B1 | 10/2002 | Farmer et al. |
| 6,462,944 B1 | 10/2002 | Lin |
| 6,554,697 B1 | 4/2003 | Koplin |
| 6,557,357 B2 | 5/2003 | Spinazzola et al. |
| 6,574,970 B2 | 6/2003 | Spinazzola et al. |
| 6,601,932 B1 | 8/2003 | Helgenberg et al. |
| 6,611,428 B1 | 8/2003 | Wong |
| 6,616,524 B2 | 9/2003 | Storck, Jr. et al. |
| 6,646,878 B2 | 11/2003 | Chan |
| 6,652,373 B2 | 11/2003 | Sharp et al. |
| 6,668,565 B1 | 12/2003 | Johnson et al. |
| 6,672,955 B2 | 1/2004 | Charron |
| 6,695,149 B1 | 2/2004 | Cote et al. |
| 6,704,196 B1 | 3/2004 | Rodriguez et al. |
| 6,745,579 B2 | 6/2004 | Spinazzola et al. |
| 6,788,535 B2 | 9/2004 | Dodgen et al. |
| 6,819,563 B1 | 11/2004 | Chu et al. |
| 6,854,284 B2 | 2/2005 | Bash et al. |
| 6,867,967 B2 | 3/2005 | Mok |
| 6,912,131 B2 | 6/2005 | Kabat |
| 7,011,576 B2 | 3/2006 | Sharp et al. |
| 7,016,194 B1 | 3/2006 | Wong |
| 7,033,267 B2 | 4/2006 | Rasmussen |
| 7,074,123 B2 | 7/2006 | Bettridge et al. |
| 7,112,131 B2 | 9/2006 | Rasmussen et al. |
| 7,144,320 B2 | 12/2006 | Turek et al. |
| 7,154,748 B2 | 12/2006 | Yamada |
| 7,182,208 B2 | 2/2007 | Tachibana |
| 7,212,403 B2 | 5/2007 | Rockenfeller |
| 7,236,362 B2 | 6/2007 | Wang et al. |
| 7,255,640 B2 | 8/2007 | Aldag et al. |
| 7,259,961 B2 | 8/2007 | Lucero et al. |
| 7,259,963 B2 | 8/2007 | Germagian et al. |
| 7,286,345 B2 | 10/2007 | Casebolt |
| 7,293,666 B2 | 11/2007 | Mattlin et al. |
| 7,309,279 B2 | 12/2007 | Sharp et al. |
| 7,349,209 B2 | 3/2008 | Campbell et al. |
| 7,355,850 B2 | 4/2008 | Baldwin |
| 7,372,695 B2 | 5/2008 | Coglitore et al. |
| 7,425,678 B2 | 9/2008 | Adducci et al. |
| 7,427,713 B2 | 9/2008 | Adducci et al. |
| 7,438,124 B2 | 10/2008 | Bhatti et al. |
| 7,438,638 B2 | 10/2008 | Lewis et al. |
| 7,472,970 B2 | 1/2009 | Bergesch et al. |
| 7,485,803 B2 | 2/2009 | Adducci et al. |
| 7,486,512 B2 | 2/2009 | Campbell et al. |
| 7,495,169 B2 | 2/2009 | Adducci et al. |
| 7,500,911 B2 | 3/2009 | Johnson et al. |
| 7,504,581 B2 | 3/2009 | Adducci et al. |
| 7,506,768 B2 * | 3/2009 | Rassmussen et al. ............ 211/26 |
| 7,508,663 B2 | 3/2009 | Coglitore et al. |
| 7,542,287 B2 | 6/2009 | Lewis, II et al. |
| 7,582,828 B2 * | 9/2009 | Ryan ............... 174/50 |
| 7,604,535 B2 | 10/2009 | Germagian et al. |
| 7,643,291 B2 | 1/2010 | Mallia et al. |
| 7,697,285 B2 | 4/2010 | Donowho et al. |
| 7,718,891 B2 | 5/2010 | Adducci et al. |
| 7,746,637 B2 | 6/2010 | Donowho et al. |
| 7,751,188 B1 | 7/2010 | French et al. |
| 7,752,858 B2 | 7/2010 | Johnson et al. |
| 7,764,495 B2 | 7/2010 | Hruby et al. |
| 7,772,489 B2 | 8/2010 | Adducci et al. |
| 7,795,532 B2 | 9/2010 | Walker |
| 7,804,685 B2 | 9/2010 | Krietzman |
| 7,839,635 B2 | 11/2010 | Donowho et al. |
| 7,880,084 B2 | 2/2011 | Adducci et al. |
| 7,894,190 B2 | 2/2011 | Davis et al. |
| 7,952,869 B2 | 5/2011 | Lewis, II et al. |
| 7,957,139 B2 | 6/2011 | Davis et al. |
| 8,035,965 B2 | 10/2011 | Adducci et al. |
| 8,040,673 B2 | 10/2011 | Krietzman |
| 8,087,979 B2 | 1/2012 | Rasmussen |
| 8,107,238 B2 | 1/2012 | Krietzman et al. |
| 8,395,046 B2 | 3/2013 | Nicewicz et al. |
| 8,403,736 B2 | 3/2013 | Rasmussen et al. |
| 8,405,984 B2 | 3/2013 | Donowho et al. |
| 2002/0101721 A1 | 8/2002 | Blood |
| 2004/0007348 A1 | 1/2004 | Stoller |
| 2004/0050808 A1 | 3/2004 | Krampotich et al. |
| 2004/0099747 A1 | 5/2004 | Johnson et al. |
| 2004/0182799 A1 | 9/2004 | Tachibana |
| 2004/0190270 A1 | 9/2004 | Aldag et al. |
| 2004/0201335 A1 | 10/2004 | Davis |
| 2005/0029910 A1 | 2/2005 | Woods |
| 2005/0153649 A1 | 7/2005 | Bettridge et al. |
| 2005/0168945 A1 | 8/2005 | Coglitore |
| 2005/0170770 A1 | 8/2005 | Johnson et al. |
| 2005/0225936 A1 | 10/2005 | Day |
| 2005/0237716 A1 | 10/2005 | Chu et al. |
| 2005/0248043 A1 | 11/2005 | Bettridge et al. |
| 2005/0280986 A1 | 12/2005 | Coglitore et al. |
| 2006/0103270 A1 | 5/2006 | Bergesch et al. |
| 2006/0141921 A1 | 6/2006 | Turek et al. |
| 2006/0276121 A1 | 12/2006 | Rasmussen |
| 2007/0064389 A1 | 3/2007 | Lewis et al. |
| 2007/0064391 A1 | 3/2007 | Lewis et al. |
| 2007/0129000 A1 | 6/2007 | Rasmussen et al. |
| 2007/0171610 A1 | 7/2007 | Lewis |
| 2007/0171613 A1 | 7/2007 | McMahan et al. |
| 2007/0173189 A1 | 7/2007 | Lewis |
| 2007/0183129 A1 | 8/2007 | Lewis et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0293138 A1 | 12/2007 | Adducci et al. |
| 2008/0002358 A1 | 1/2008 | Casebolt |
| 2008/0007911 A1 | 1/2008 | Hallin et al. |
| 2008/0035810 A1 | 2/2008 | Lewis |
| 2008/0037228 A1 | 2/2008 | Lewis |
| 2008/0062654 A1 | 3/2008 | Mattlin et al. |
| 2008/0068791 A1 | 3/2008 | Ebermann |
| 2008/0074849 A1 | 3/2008 | Adducci et al. |
| 2008/0174217 A1 | 7/2008 | Walker |
| 2008/0266789 A1 | 10/2008 | Hruby et al. |

(56) References Cited

U.S. PATENT DOCUMENTS

| | | |
|---|---|---|
| 2008/0316702 A1 | 12/2008 | Donowho et al. |
| 2008/0316703 A1 | 12/2008 | Donowho et al. |
| 2009/0059523 A1 | 3/2009 | Mallia et al. |
| 2009/0061755 A1 | 3/2009 | Calder et al. |
| 2009/0129013 A1 | 5/2009 | Donowho et al. |
| 2009/0190307 A1 | 7/2009 | Krietzman |
| 2009/0227197 A1 | 9/2009 | Lewis et al. |
| 2009/0239460 A1 | 9/2009 | Lucia et al. |
| 2009/0239461 A1 | 9/2009 | Lewis et al. |
| 2010/0061059 A1 | 3/2010 | Krietzman et al. |
| 2010/0172092 A1 | 7/2010 | Davis et al. |
| 2010/0172093 A1 | 7/2010 | Davis et al. |
| 2010/0248610 A1 | 9/2010 | Caveney et al. |
| 2011/0019362 A1 | 1/2011 | Krietzman |
| 2011/0148261 A1 | 6/2011 | Donowho et al. |
| 2011/0287704 A1 | 11/2011 | Lewis, II et al. |
| 2011/0290553 A1 | 12/2011 | Behrens et al. |
| 2012/0013229 A1 | 1/2012 | Krietzman |
| 2012/0112612 A1 | 5/2012 | Krietzman |
| 2013/0160271 A1 | 6/2013 | Krietzman et al. |
| 2013/0165035 A1 | 6/2013 | Krietzman et al. |

FOREIGN PATENT DOCUMENTS

| | | | |
|---|---|---|---|
| DE | 20207426 U1 | | 9/2002 |
| EP | 2205054 A1 | | 7/2010 |
| GB | 2354066 A | | 3/2001 |
| JP | 2000-193792 A | | 7/2000 |
| JP | 2000-286580 | | 10/2000 |
| JP | 2003-056993 A | | 2/2003 |
| JP | 2004-200594 | | 7/2004 |
| JP | 2004-252758 | | 9/2004 |
| JP | 2007-212092 A | | 8/2007 |
| WO | 9948305 | | 9/1999 |
| WO | 2006055506 A2 | | 5/2006 |
| WO | 2008022058 A2 | | 2/2008 |
| WO | 2008022058 A3 | | 11/2008 |
| WO | 2008144678 A1 | | 11/2008 |
| WO | 2009089008 A2 | | 7/2009 |
| WO | 2009103090 A2 | | 8/2009 |
| WO | 2009103090 A3 | | 10/2009 |
| WO | 2010028384 A2 | | 3/2010 |
| WO | 2010117699 A1 | | 10/2010 |

OTHER PUBLICATIONS

Information Disclosure Statement (IDS) Letter Regarding Common Patent Application(s), dated Jan. 14, 2013.

Information Disclosure Statement (IDS) Letter Regarding Common Patent Application(s), dated Aug. 18, 2011.

"International Search Report" and "Written Opinion of the International Searching Authority" (ISA/US Alexandria, Virginia Office) in Chatsworth Products, Inc. et al., International Patent Application Serial No. PCT/US07/75763, dated Aug. 13, 2008, 13 pages.

"International Search Report" and "Written Opinion of the International Search Authority" (Korean Intellectual Property Office) in Chatsworth Products, Inc. et al., International Patent Application Serial No. PCT/US2008/064174, dated Oct. 30, 2009, 9 pages.

"International Search Report" and "Written Opinion of the International Search Authority" (Korean Intellectual Property Office) in Chatsworth Products, Inc. et al., International Patent Application Serial No. PCT/US2009/034338, dated Sep. 1, 2009, 7 pages.

"International Search Report" and "Written Opinion of the International Searching Authority" (ISA/US Korean Intellectual Property Office) in Chatsworth Products, Inc. et al., International Patent Application Serial No. PCT/US2009/056256, Apr. 7, 2010, 7 pages.

Rasmussen, Neil, "Air Distribution Architecture Options for Mission Critical Facilities", White Paper #55, 2003, pp. 1-13, Revision 1, American Power Conversion (APC), West Kingston, Rhode Island.

Chatsworth Products, Inc., "Thermal Management Solutions", Signature Solutions Brochure, Revision dated Mar. 2008, 6 pages, www.chatsworth.com/passivecooling.

HP 10000 G2 42U Rack Air Duct Installation Guide, Hewlett-Packard Development Company, LP, dated Aug. 2008, 23 pages.

Panduit Net-Access Vertical Exhaust Duct (VED) Instructions, Panduit Corporation, dated 2009, 4 pages.

Panduit Net-Access Vertical Exhaust System (VES) Specification Sheet, Panduit Corporation, dated Feb. 2011, 4 pages.

Information Disclosure Statement (IDS) Letter Regarding Common Patent Application(s), dated Aug. 2, 2012.

* cited by examiner

MAGNETIC FILLER PANEL FOR USE IN AIRFLOW CONTROL SYSTEM IN ELECTRONIC EQUIPMENT ENCLOSURE

CROSS-REFERENCE TO RELATED APPLICATION

The present application is a U.S. nonprovisional patent application of, and claims priority under 35 U.S.C. §119(e) to, U.S. provisional patent application No. 61/350,128, filed Jun. 1, 2010, which '128 application is incorporated by reference herein in its entirety.

Additionally, U.S. patent application Ser. No. 12/652,136 to Davis et al., filed Jan. 5, 2010 and entitled "ELECTRONIC EQUIPMENT ENCLOSURE WITH SIDE-TO-SIDE AIRFLOW CONTROL SYSTEM," which published as US 2010/0172092 A1 on Jul. 8, 2010, is incorporated herein by reference and is intended to provide background and technical information with regard to the systems and environments of the inventions of this patent application. The '136 application and the publication thereof are each incorporated by reference herein in their entireties.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

1. Field of the Present Invention

The present invention generally relates to air flow management within an electronic equipment enclosure, and in particular to a magnetic filler panel for use in an airflow control system in such an enclosure.

2. Background

Racks, frames, cabinets and the like for supporting computer and other electronic equipment are well known. Such support apparatus are often partially or fully enclosed, either directly through the use of doors and panels mounted directly thereon, or indirectly by lining several such apparatuses up in a row such that the sides of each rack are immediately adjacent another rack.

As is also well known, the electronic equipment mounted therein tends to generate large amounts of heat that need to be exhausted away from the equipment effectively in order to maintain the equipment in proper operating order or to prevent damage thereto. As equipment has become more densely packed with electronics, the quantities of heat have continued to increase in recent years. Heat management has thus become a significant issue confronting today's rack, cabinet, frame and enclosure manufacturers, the manufacturers of the electronic equipment, and the users of such equipment.

Each piece of equipment is often enclosed within an individual chassis or housing that includes a location, typically referred to as an exhaust grille, where air that has been circulated therethrough is exhausted. The heated air is frequently forced or forcibly drawn out of the various active pieces of equipment through exhaust grilles of the equipment by internal fans, often supplemented by separate fans mounted in or on the enclosure. In many pieces of equipment, the exhaust grille is located on the rear of the equipment, and the equipment is often cooled by bringing cool air to the front of the equipment and exhausted through the rear, often through a door or through exhaust openings in a panel. Other equipment uses the opposite configuration, wherein cool air is brought to the rear of the equipment and exhausted through the front; this may be handled generally similarly as the rear exhaust except that the front and rear of the cabinet are generally reversed. Still other equipment is arranged to receive cold air from the side and to exhaust heated air from the opposite side. For example, a common piece of electronic equipment in modern computer networks is a switch. Switches tend to generate a significant amount of heat, and therefore are of particular concern in exhausting heat from an electronic equipment enclosure, and at least some are manufactured with inlets on one side and exhaust grilles on the other side. Such equipment requires different treatment than front/rear exhaust equipment.

In order to control the flow of air within an electronic equipment enclosure, various ducts, risers, manifolds and other structures may be utilized to route air and prevent heated exhaust air from mixing with cooled intake air. One particular structure utilized in this effort is a blanking panel or filler panel which may be installed to prevent both cool air from seeping into the cabinet and exhaust air from re-circulating back from the rear of the cabinet to the front causing a mixing of warm and cool air. For example, FIG. 1 is an isometric view of a prior art filler panel for use in an electronic equipment enclosure system. Conventional filler panels are substantially planar in construction, are made from metal, plastics and plastic sheet material, and include mounting apertures at their ends. At least some panels are a whole number of standard rack mounting units (RMUs) in height and are wide or long enough to be mounted to the front of the vertical frame members or other structural members of an electronic equipment enclosure system using fasteners routed through corresponding apertures therein.

Unfortunately, the creation of the apertures is expensive, and the panels must be fastened to vertical mounting rails or other members with screws and/or cage nuts, which can be quite time-consuming when deploying thousands of filler panels within a typical Data Center environment. A partial solution to the latter problem was to manufacture the filler panels with a tool-less captive fastener, but although simplifying installation somewhat, the manufacturing cost is still greater and every different panel size had to be appropriately tooled.

Furthermore, the apertures allow small amounts of air to leak past the filler panel. Even worse, the use of fasteners to attach the ends of the filler panels to the vertical members has a tendency to create a close, nearly-sealed fit around the points of attachment but allowing, and even causing, gaps to form elsewhere between the ends of the filler panels and the vertical members.

Thus, a need exists for an inexpensive panel that is easy to install and provides a tight seal between the ends thereof and the vertical members to which it is mounted.

SUMMARY OF THE PRESENT INVENTION

The present invention according to a first aspect is an electronic equipment enclosure system with an airflow control system, including: an enclosure, having a front, a rear, a top, a bottom and two sides; and a magnetic filler panel.

In a feature of this aspect, the magnetic filler panel is comprised of a panel body and at least one magnetic region.

In a further feature, the magnetic filler panel includes a plurality of magnetic regions. In a still further feature, at least one of the plurality of magnetic regions is located at each end of the panel body.

In another further feature, the at least one magnetic region is located at an end of the panel body.

In another further feature, the at least one magnetic region has a height of about one RMU.

In another further feature, the at least one magnetic region has a height that extends the full vertical height of the panel body.

In another further feature, the at least one magnetic region has a height that is less than the full vertical height of the panel body.

In another further feature, the magnetic filler panel is configured to be magnetically mounted directly to one or more vertical members of the enclosure. In a still further feature, the magnetic filler panel has a length approximating the distance between two vertical members of the enclosure.

In another further feature, the magnetic filler panel is configured to be magnetically mounted to one or more vertical mounting rails mounted in the enclosure.

In another further feature, the at least one magnetic region includes a separate magnetic strip attached to the panel body.

In another further feature, the at least one magnetic region is integral with the panel body.

In another further feature, the panel body is comprised of a metal material.

In another further feature, the panel body is comprised of a plastic material.

In another further feature, at least a portion of the panel body is transparent.

In another further feature, at least a portion of the panel body is semitransparent.

In another further feature, the magnetic filler panel is configured to partition a first plenum from a second plenum within the enclosure.

The present invention according to a second aspect is a magnetic filler panel for use in an airflow control system in an electronic equipment enclosure system, including: a panel body having opposite ends; and a magnetic region arranged at each end of the panel body.

In a feature of this aspect, the magnetic region has a height of about one RMU.

In a further feature, the magnetic region has a height that extends the full vertical height of the panel body.

In another further feature, the magnetic region has a height that is less than the full vertical height of the panel body.

In another further feature, the magnetic regions are configured to be magnetically mounted directly to one or more vertical members of the enclosure. In a still further feature, the magnetic filler panel has a length approximating the distance between two vertical members of the enclosure.

In another further feature, the magnetic regions are configured to be magnetically mounted to one or more vertical mounting rails mounted in the enclosure.

In another further feature, the magnetic region includes a separate magnetic strip attached to the panel body.

In another further feature, the magnetic region is integral with the panel body.

In another further feature, the panel body is comprised of a metal material.

In another further feature, the panel body is comprised of a plastic material.

In another further feature, at least a portion of the panel body is transparent.

In another further feature, at least a portion of the panel body is semitransparent.

In another further feature, the magnetic filler panel is configured to partition a first plenum from a second plenum within the enclosure.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
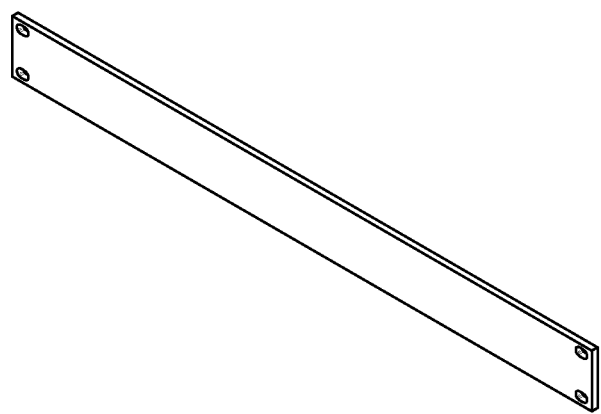
FIG. 1 is an isometric view of a prior art filler panel for use in an electronic equipment enclosure system.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of one or more preferred embodiment(s) is merely exemplary in nature and is in no way intended to limit the invention, its application, or uses. One or more aspects of the present invention pertain to the control of airflow within an electronic equipment enclosure system. In order to illustrate the use of filler panels in assisting such airflow control, an exemplary enclosure system 10 is next shown and described with particular regard to FIGS. 2-5. The particular example selected is taken from the aforementioned U.S. patent application Ser. No. 12/652,136, which utilizes various filler panels in a side-to-side airflow control system. Greater detail regarding such control system is provided therein.

Figure 2:
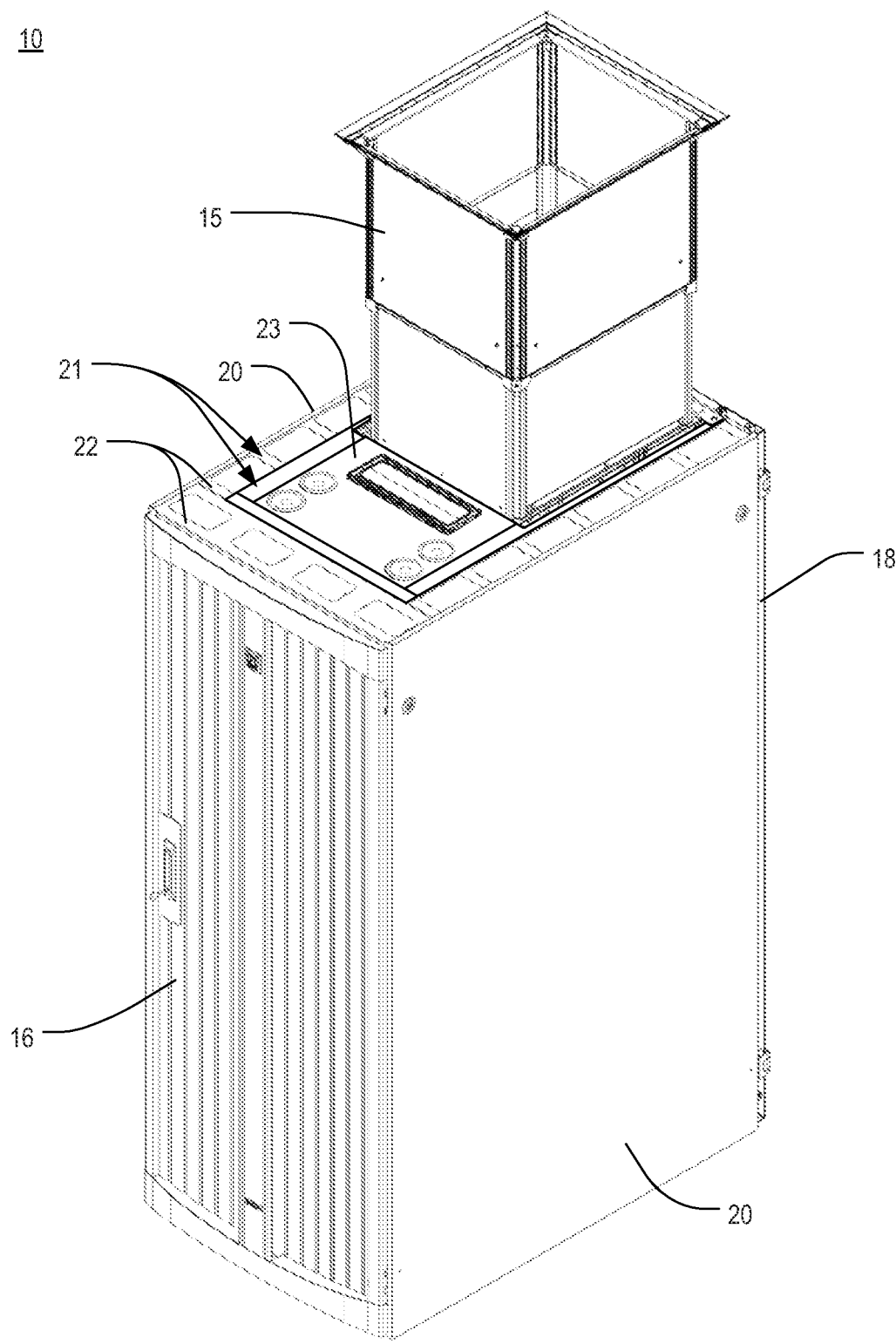
FIG. 2 is an isometric view of an exemplary electronic equipment enclosure system having an airflow control system making use of filler panels.
Figure 3:
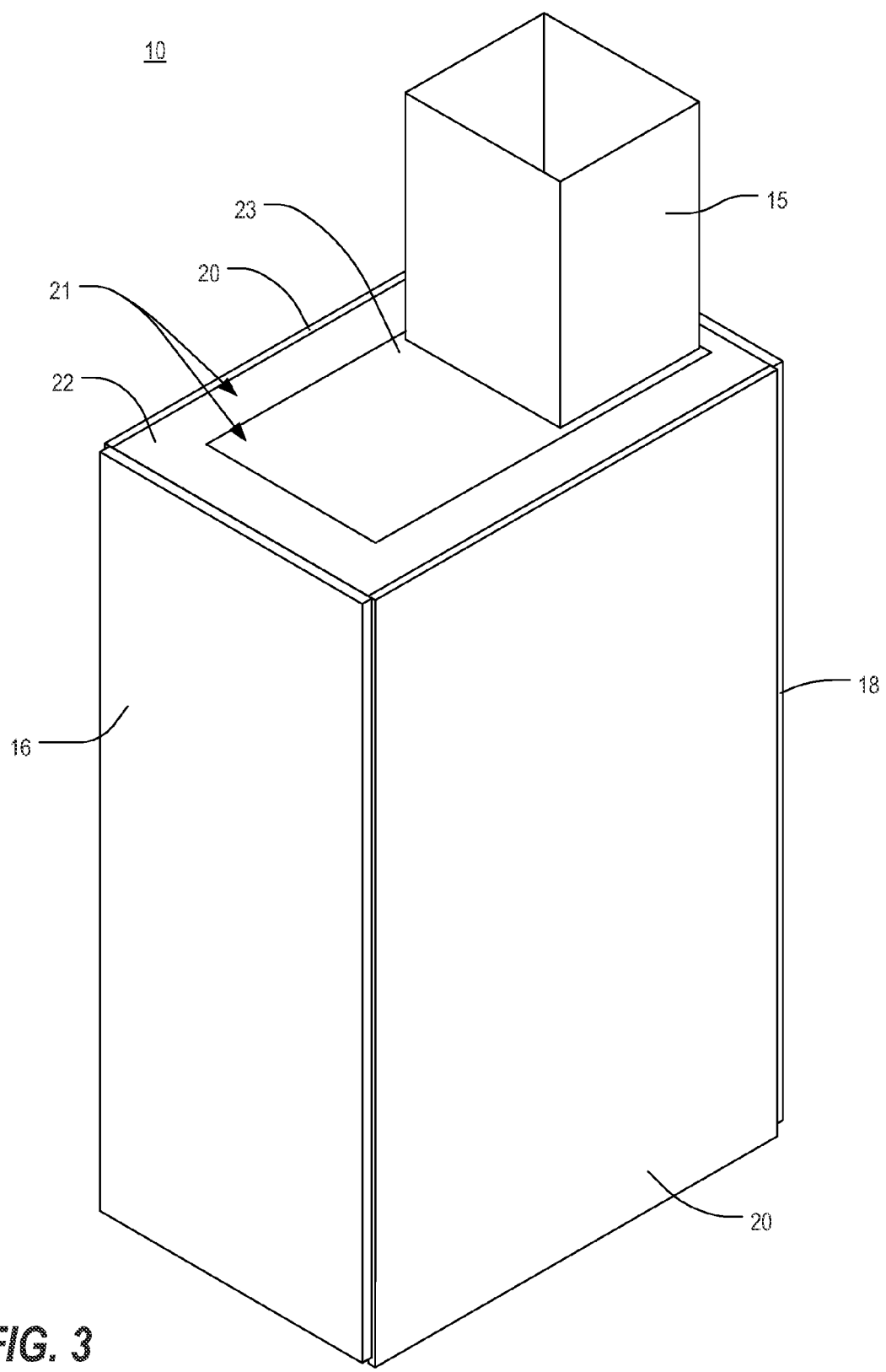
FIG. 3 is an isometric schematic view of the enclosure system of FIG. 2.

In particular, FIG. 2 is an isometric view of an exemplary electronic equipment enclosure system 10 having an airflow control system making use of filler panels, and FIG. 3 is an isometric schematic view of the enclosure system 10 of FIG. 2. As shown therein, the enclosure system 10, which may be generally conventional, includes a front panel 16, a rear panel 18, a pair of side panels 20 and a top panel 21. In the illustrated arrangement, the front panel 16 is implemented as a single hinged door and the back panel 18 is implemented as a pair of hinged doors. In this regard, it will be apparent that various replacement components may be substituted for the various components of the enclosure system, without departing from the scope of the present invention.

The particular enclosure system 10 that is illustrated also includes a vertical exhaust duct 15, and the top panel 21 is shown as including a central top panel 23 and a top panel extension kit 22, wherein the top panel extension kit 22 may include a plurality of top panel elements that are each co-planar with the central top panel 23. These features are merely an example of one particular implementation of an enclosure system 10 and are not meant to be limiting. Indeed, many alternative enclosure system arrangements are possible that make no use of a vertical exhaust duct whatsoever, as will be apparent to the Ordinary Artisan. Nonetheless, a vertical exhaust duct 15 suitable for use in the enclosure system 10 of FIGS. 2 and 3 is fully disclosed in commonly-assigned U.S. patent application Ser. No. 12/344,367, published as US 2009/0190307 A1 (the "'367 application"), which is incorporated herein by reference.

Figure 4:
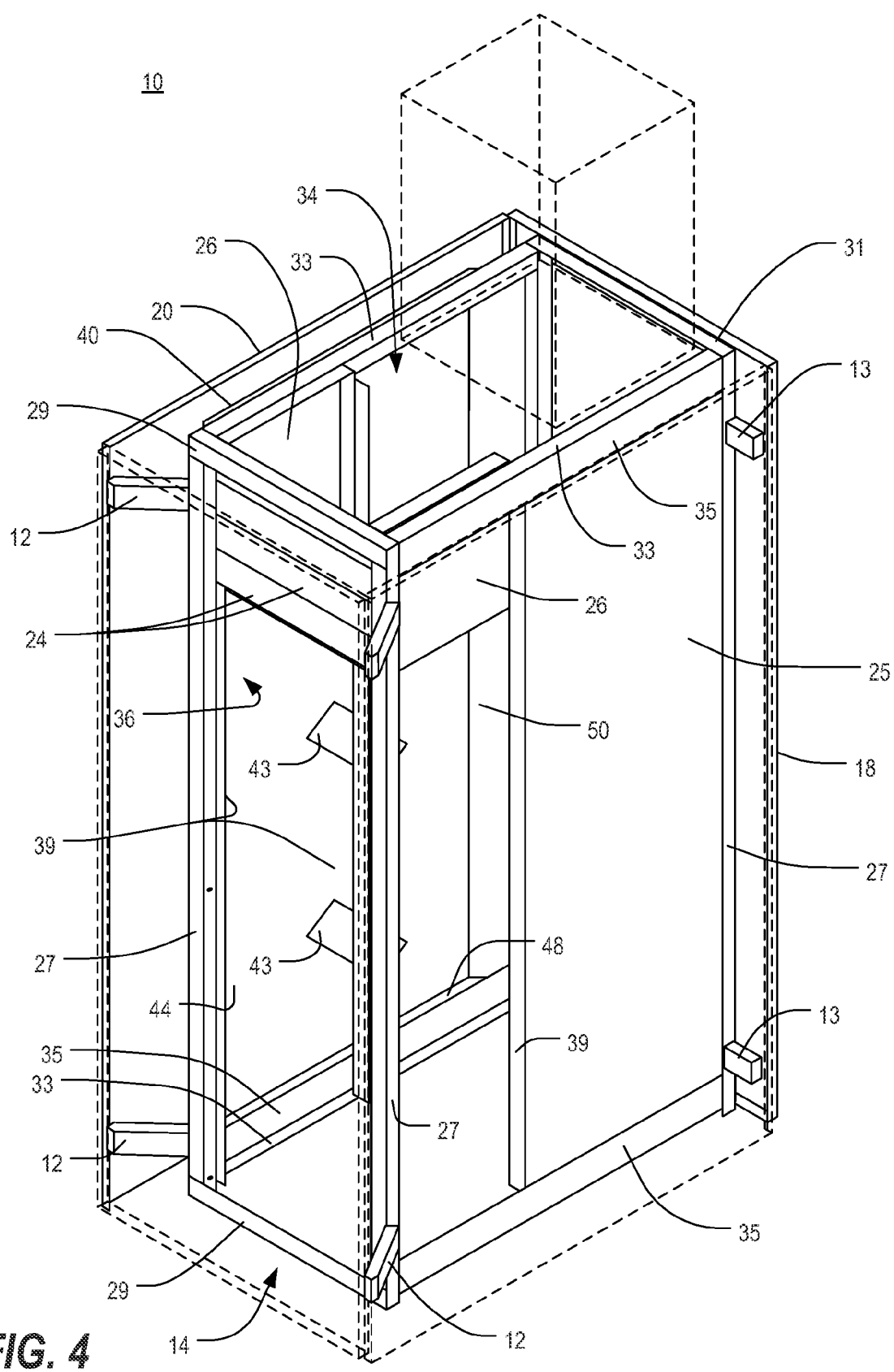
FIG. 4 is an isometric schematic view of the enclosure system of FIG. 3, shown with the top panel, the right panel, the front panel and the vertical exhaust duct removed and their locations shown in broken lines.

FIG. 4 is an isometric schematic view of the enclosure system 10 of FIG. 3, shown with the top panel, the right panel, the front panel and the vertical exhaust duct removed and their locations shown in broken lines. The interior four post frame structure 14, which may be of conventional design and construction, includes a plurality of frame members including four vertical members 27, upper and lower front cross members 29, upper and lower rear cross members 31 and two pairs of upper and lower side depth members 33. Each vertical member 27 includes a plurality of cross member attachment apertures at each end. Two of the vertical members 27 are connected together at their upper and lower ends by the upper and lower front cross members 29, respectively, and the other two vertical members 27 are connected together at their upper and lower ends by the upper and lower rear cross members 31, respectively. The front cross members 29 and their respective vertical members 27 thus define a front frame, and the rear cross members 31 and their respective vertical members 27 define a rear frame. The front and rear frames may then be connected together at their respective corners by the upper and lower depth members 33.

Figure 11:
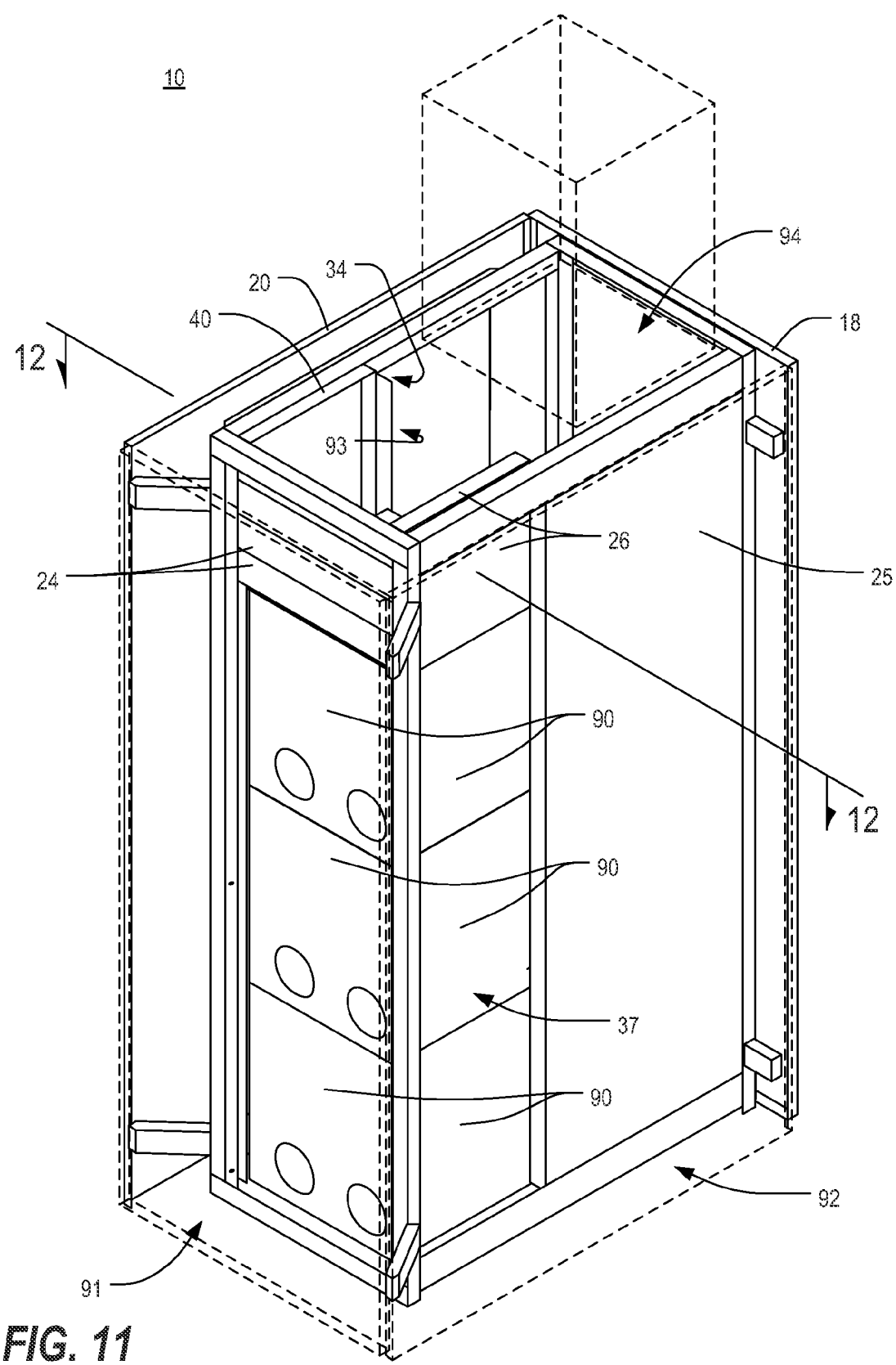
FIG. 11 is an isometric schematic view similar to that of FIG. 4, shown with three servers installed therein.

In the illustrated embodiment, each depth member 33 includes an integrated horizontal mounting rail 35 that includes two rows of mounting apertures extending along its entire length (shown, for example, in FIG. 11 of the '367 Application). However, in other embodiments, the integrated horizontal mounting rails 35 may be replaced by, or supplemented with, separate mounting rails that may be disposed at the top or bottom of the vertical members 27 or at any location therebetween. Furthermore, the mounting apertures in either the integrated or separate horizontal mounting rails may be replaced by longitudinal mounting slots running substantially the length of horizontal mounting rail. Optionally, vertical mounting rails 39 may be mounted to the horizontal mounting rails 35. Each vertical mounting rail 39 preferably includes a series of threaded mounting apertures, spaced at regular intervals or regular patterns of intervals, extending along substantially its entire length, for use in mounting electronic components, peripheral devices, cable brackets, additional mounting members, or the like thereto.

As illustrated in FIG. 4, the various panels forming the enclosure may be supported by offset brackets 12,13, which may be of different types, that are connected to an interior four post frame structure 14. Offset brackets 12 of a first type (and one or more alternative arrangements thereof) are described in greater detail in commonly-assigned U.S. patent application Ser. No. 11/837,537, published as US 2008/0035810 A1 (the "'537 application), which is incorporated herein by reference. Alternatively, one or more of the panels are mounted directly to vertical members 27 or some other portion of the interior frame structure 14 without the need for offset brackets.

Each of the offset brackets 12,13 may be mounted to the front- or rear-facing surface of a vertical member 27, as appropriate, such that it extends outwardly, away from the interior frame structure 14 in such a way as to provide orthogonal mounting surfaces at its distal end for mounting respective orthogonal panels. The offset brackets 12,13 provide versatility for a traditional frame structure by providing a means to support the various front, rear and side panels 16,18,20 away from the frame structure 14. Because the various panels 16,18,20 are thus located farther away from the equipment mounted in the interior of the frame structure 14 than panels mounted directly to the frame structure 14 would be, additional space is thus provided between the interior frame structure 14 and one or more of the side, front and rear panels (as illustrated in the '537 application) for cables, internal ducts, or other accessories. More particularly, the offset brackets 12,13 may be utilized to adapt a conventional frame structure 14 to hold larger doors and side panels than could be accommodated by the interior frame structure 14 by itself, thereby increasing the area available for cable management and/or thermal management in the side space and front and back space of a data center cabinet while creating minimal impediment to cables entering through a raised floor tile or cabinet top panel.

The vertical members 27 are preferably constructed of a material, such as steel, having a significant degree of magnetism such that when a permanent magnet is brought into close proximity therewith, a substantial magnetic bond is formed between the permanent magnet and the vertical member 27.

Figure 5:
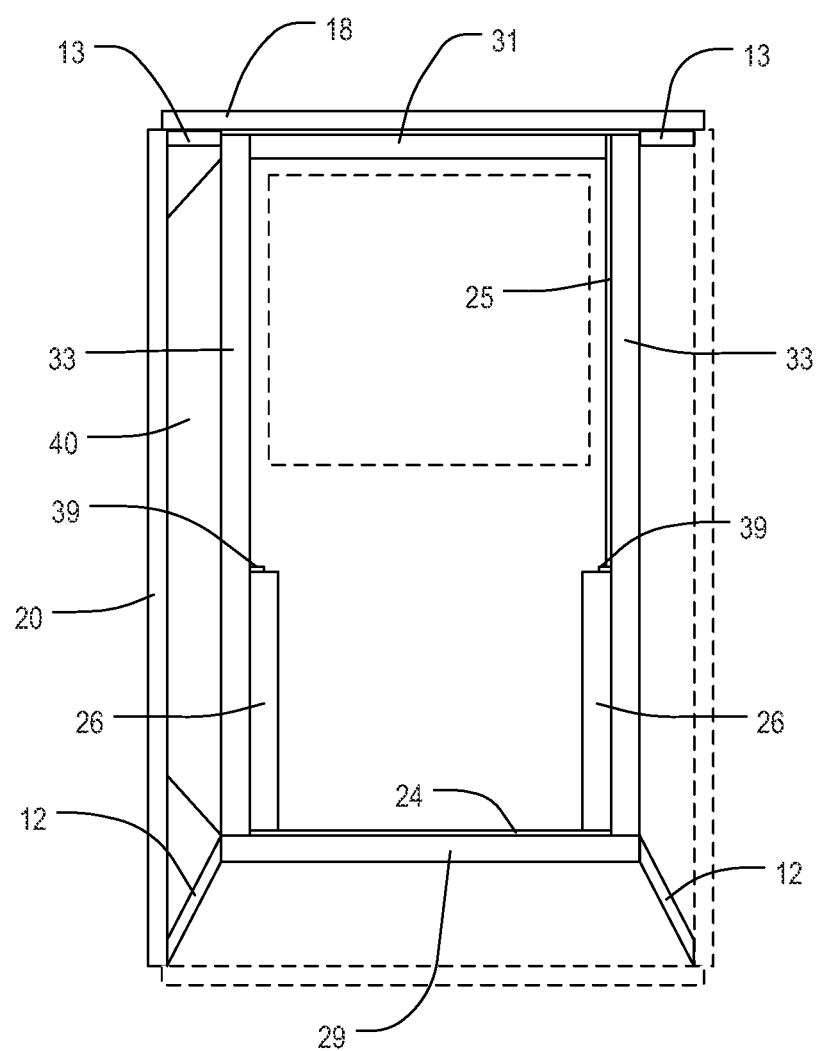
FIG. 5 is a top schematic view of the enclosure system of FIG. 4.

FIG. 5 is a top schematic view of the enclosure system 10 of FIG. 4. With reference to FIGS. 4 and 5, the airflow control system includes a plurality of magnetic front filler panels 24 as well as a side wall 25, two side filler panel assemblies 26, and a wall manifold 40. In the illustrated arrangement, the front filler panels 24 work together with the other elements of the airflow control system to partition the interior of the enclosure into different spaces, in fluid communication with one another, that function together to guide the flow of air through the enclosure in such a way as to facilitate side-to-side airflow through equipment mounted in the enclosure. It will be appreciated, however, that the elements of the airflow control system shown in FIGS. 4 and 5 are merely exemplary, and that the magnetic filler panels 24 may likewise be utilized with a variety of airflow control elements or by themselves.

Figure 6:
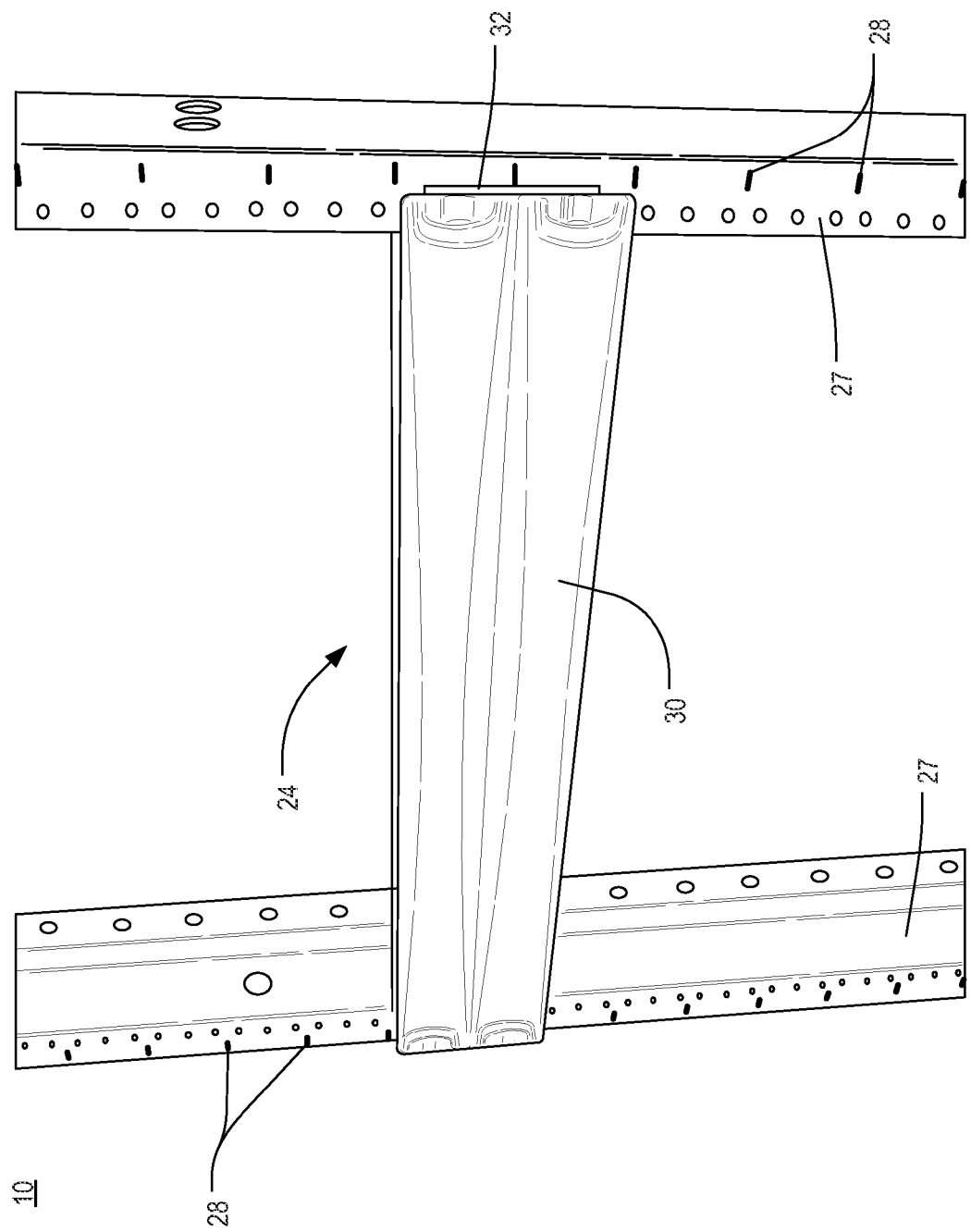
FIG. 6 is a front perspective view of a single filler panel, installed in an enclosure system like that of FIG. 3, in accordance with a first preferred embodiment of the present invention.
Figure 7:
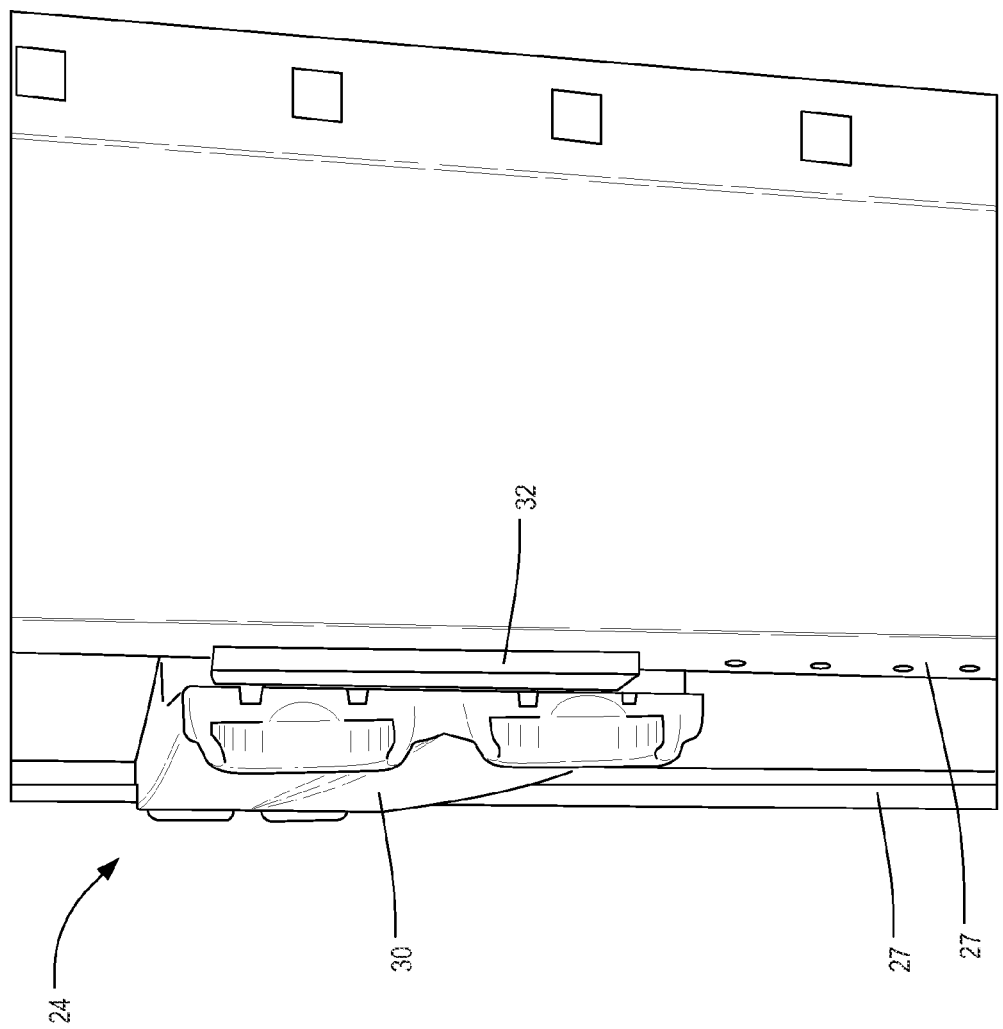
FIG. 7 is an end perspective view of a portion of the filler panel installation of FIG. 6.
Figure 8:
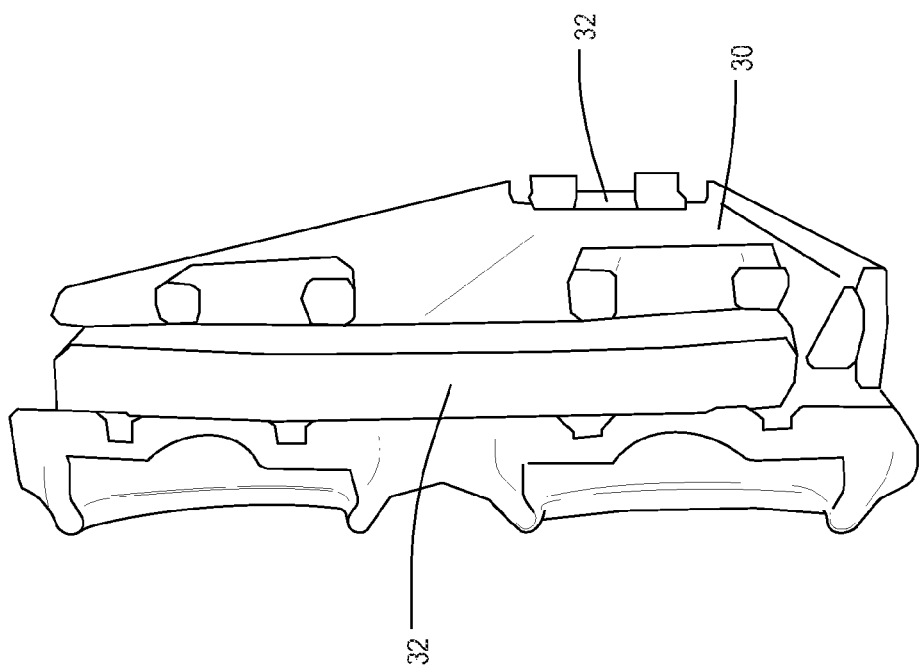
FIG. 8 is an end perspective view of the filler panel of FIGS. 6 and 7.

FIG. 6 is a front perspective view of a single magnetic filler panel 24, installed in an enclosure system 10 like that of FIG. 3, in accordance with a first preferred embodiment of the present invention, while FIG. 7 is an end perspective view of a portion of the filler panel installation of FIG. 6, and FIG. 8 is an end perspective view of the filler panel 24 of FIGS. 6 and 7. In FIGS. 6 and 7, the filler panels 24 are shown as being mounted directly on the vertical members 27 of the enclosure system 10, but it will be appreciated that they may alternatively be mounted on vertical mounting rails 39 if provided, or in some cases to the surfaces of other mounting structures.

As shown in FIGS. 6-8, the filler panel 24 includes an elongated panel body 30 having a magnetic strip 32 disposed at each end. The particular magnetic filler panel 24 shown is two RMUs in height, as indicated by the RMU incremental markings 28 arranged in a column along each vertical member 27. It will be appreciated, however, that panels 24 having other heights may likewise be provided without departing from the scope of the present invention. However, it will be further appreciated that heights in increments of whole numbers of RMUs may be preferred over other heights so as to correspond to most standard enclosure systems. For instance, it is also contemplated that the magnetic filler panel 24 may be approximately one RMU or approximately three RMUs in height. The length of each panel 24 preferably corresponds to the spacing between the vertical members 27 to which the panel 24 is to be mounted so that the magnetic strips 32 at the ends of the panel body 30 may be easily connected by magnetic bond to those vertical members 27. The panel length is thus chosen based on the typical spacing between vertical members 27.

In at least some embodiments, the magnetic strips 32 extend the full vertical height of the panel body 30, thereby facilitating a tight air seal between the ends of the filler panel 24 and the vertical members 27 to which it is mounted. However, some advantage with regard to ease of installation may still be gained through the use of magnetic strips that do not extend the full vertical height.

The panels may have built-in indexing alignment features. Visual alignment features may be included as well in order to aid the installer or other user in properly positioning the panel 24 on the vertical members 27.

Each panel may include various surface features.

Figure 9:
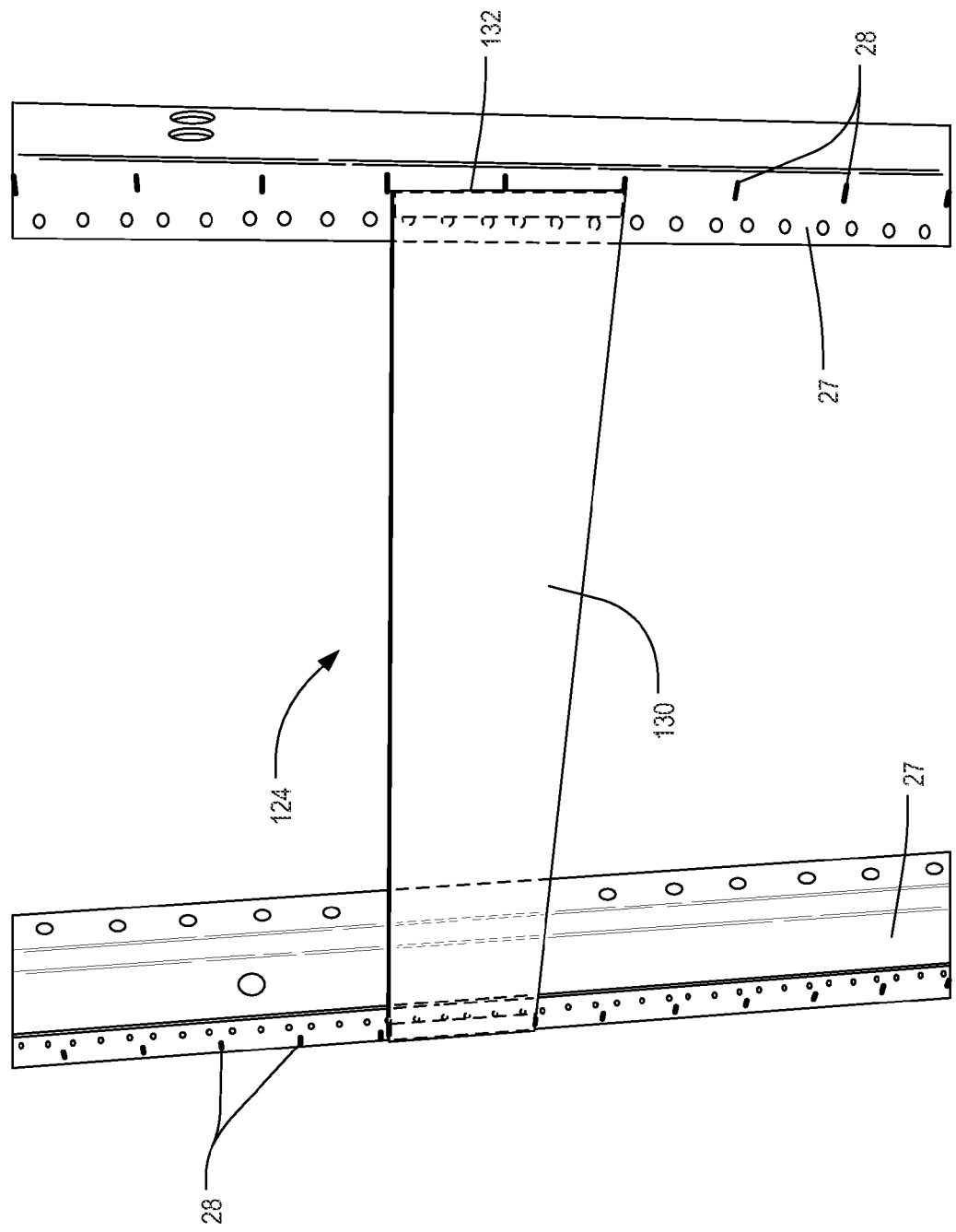
FIG. 9 is a front perspective view of a filler panel installed in an enclosure system like that of FIG. 3 in accordance with a second preferred embodiment of the present invention.
Figure 10:
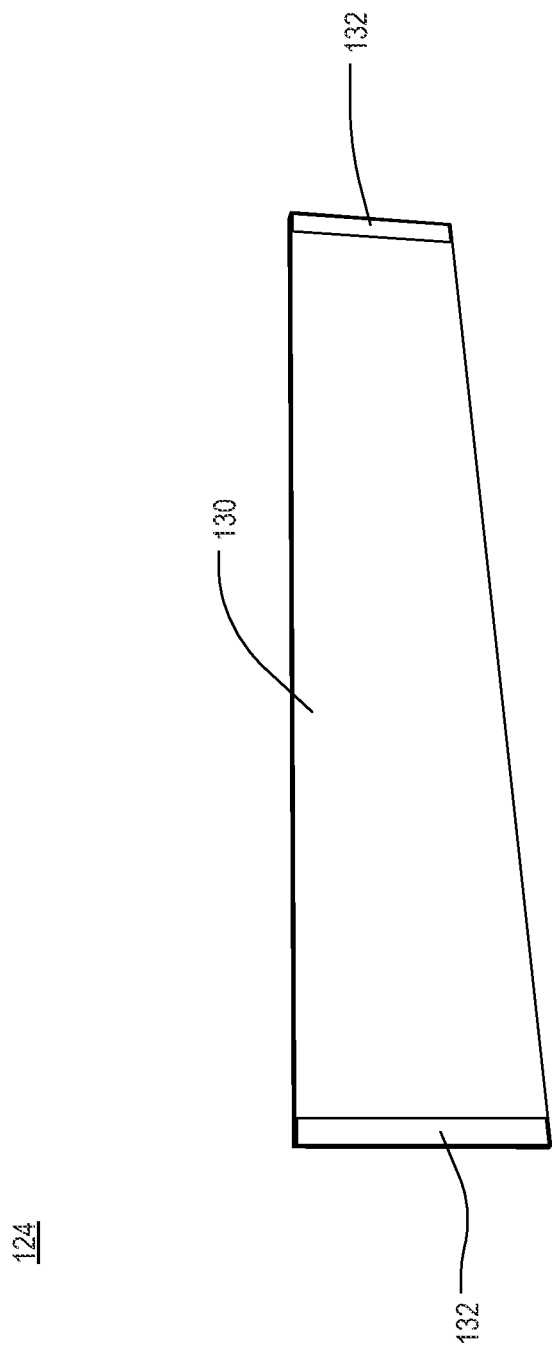
FIG. 10 is a rear perspective view of the filler panel of FIG. 9.

Alternative embodiments of a magnetic filler panel may utilize a simpler construction. One example is illustrated in FIG. 9, which is a front perspective view of a magnetic filler panel 124, installed in an enclosure system 10 like that of FIG. 3, in accordance with a second preferred embodiment of the present invention, and FIG. 10 is an rear perspective view of the magnetic filler panel 124 of FIG. 9. In FIG. 9, the filler panels 24 are shown as being mounted directly on the vertical members 27 of the enclosure system 10, but it will be appreciated that they may alternatively be mounted on vertical mounting rails 39 if provided, or in some cases to the surfaces of other mounting structures.

As shown in FIGS. 9 and 10, the magnetic filler panel 124 includes an elongated panel body 130 having a magnetic region 132, which need not be a separate strip, arranged at each end. The particular magnetic filler panel 124 shown is two RMUs in height, as indicated by the RMU incremental markings 28 arranged in a column along each vertical member 27. Once again, it will be appreciated that panels 124 having other heights may likewise be provided without departing from the scope of the present invention, but that heights in increments of whole numbers of RMUs may be preferred over other heights so as to correspond to most standard enclosure systems. The length of each panel 124 preferably corresponds to the spacing between the vertical members 27 to which the panel 124 is to be mounted so that the magnetic regions 132 at the ends of the panel body 130 may be easily connected by magnetic bond to those vertical members 27. The panel length is thus chosen based on the typical spacing between vertical members 27.

The body 30,130 of each magnetic filler panel 24,124 may be constructed from metal, plastic, or the like. In various embodiments, the bodies may be extruded, molded, or otherwise fabricated using conventional manufacturing techniques and processes.

In at least one embodiment, such as the one illustrated in FIG. 9, the panel body 130 is transparent or semitransparent to make it easier for an installer or other user to position the panel 124 on the vertical members 27.

With regard to the term "standard rack mounting units" or "RMU," it is well known that the vertical dimension of equipment enclosures is frequently measured in standardized units. The most common unit of measurement is the "rack mounting unit" ("RMU"). According to accepted standards, an RMU is defined as 1.75 inches in height. Electrical components as well as accessories, which include horizontal raceways, patch panels, and the like, are also commonly measured in RMUs. For example, a 2 RMU component is one which is 3.50 inches or less in height. Thus, a rack which has 45 RMUs may accommodate components and accessories totaling 45 RMUs. Further, to conserve space, components and accessories are frequently installed only at vertical locations corresponding to a whole number of RMUs in order to avoid interfering with adjacent components and accessories. Further information about the term "standard rack mounting units" or "RMU" is available in U.S. Pat. No. 7,119,282 to Krietzman, et al., the entirety of which is incorporated herein by reference.

The magnetic filler panels 24,124 may be utilized in a variety of ways to fill spaces, and, in particular, to more effectively block the flow of air in an enclosure system 10 such as that of FIGS. 2-5. One such usage is illustrated in FIG. 11, which is an isometric schematic view similar to that of FIG. 4, shown with three servers 90, utilizing side-to-side cooling, installed therein. In the arrangement depicted therein, it is assumed that each server is of a type that receives cooling air through one or more intakes located on the right side and exhausts it via one or more outlets on the left side. It will be appreciated that the illustrated example, the magnetic filler panels 24 (for which other magnetic filler panels 124 may be substituted), the side wall 25, the side filler panel assemblies 26, the wall manifold 40, the rear and side 18,20 and the exterior surfaces of the servers 90 themselves create a front plenum 91, a right side plenum 92, a left side plenum 93 and a rear plenum 94. In particular, the magnetic filler panels 24 partition the front plenum 91 from the rear plenum 94. It will be further appreciated that the front plenum 91 is in fluid communication with the right side plenum 92, that the left side plenum 93 is in fluid communication with the rear plenum 94 via the exhaust opening 34 of the manifold 40, and that the rear plenum 94 is in fluid communication with the interior of the vertical exhaust duct 15. Still further, it will be appreciated that the intakes of the servers 90 are in fluid communication with the right side plenum 92 via the side wall opening 37, and that the outlets of the servers 90 are in fluid communication with the left side plenum 93 via the manifold inlet opening 36.

Figure 12:
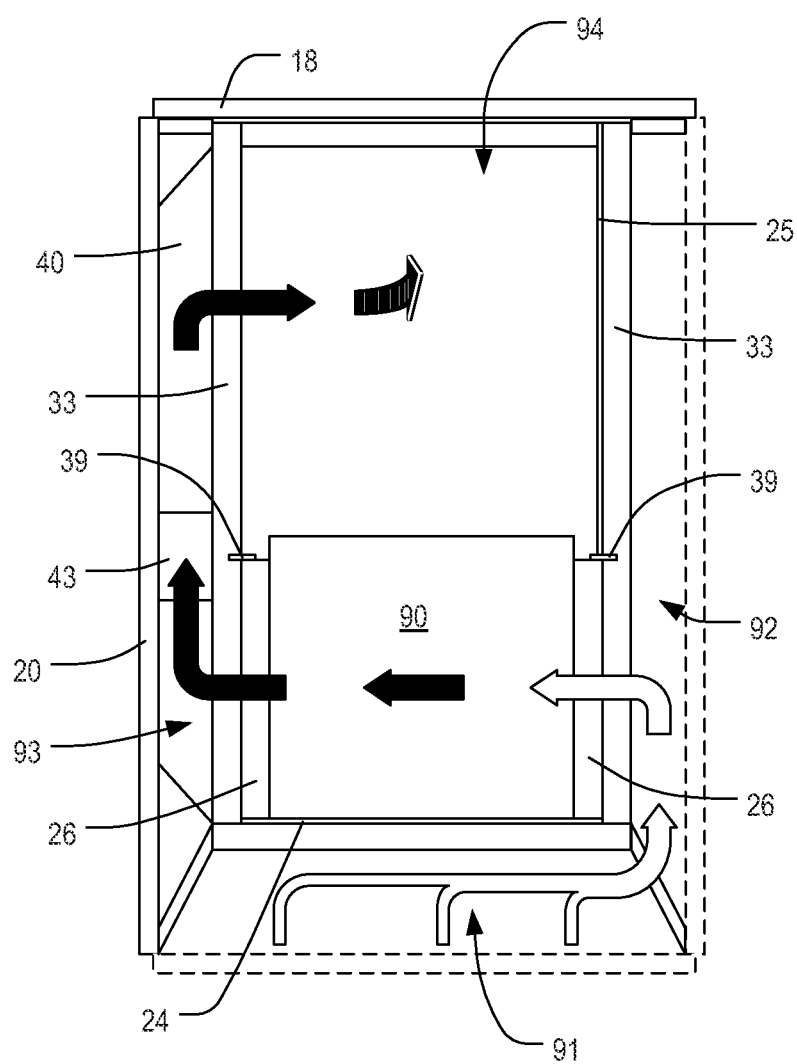
FIG. 12 is a top cross-sectional schematic view of the enclosure system of FIG. 11, taken along line 12-12, illustrating exemplary use of filler panels such as those of FIGS. 6 and 9.
Figure 13:
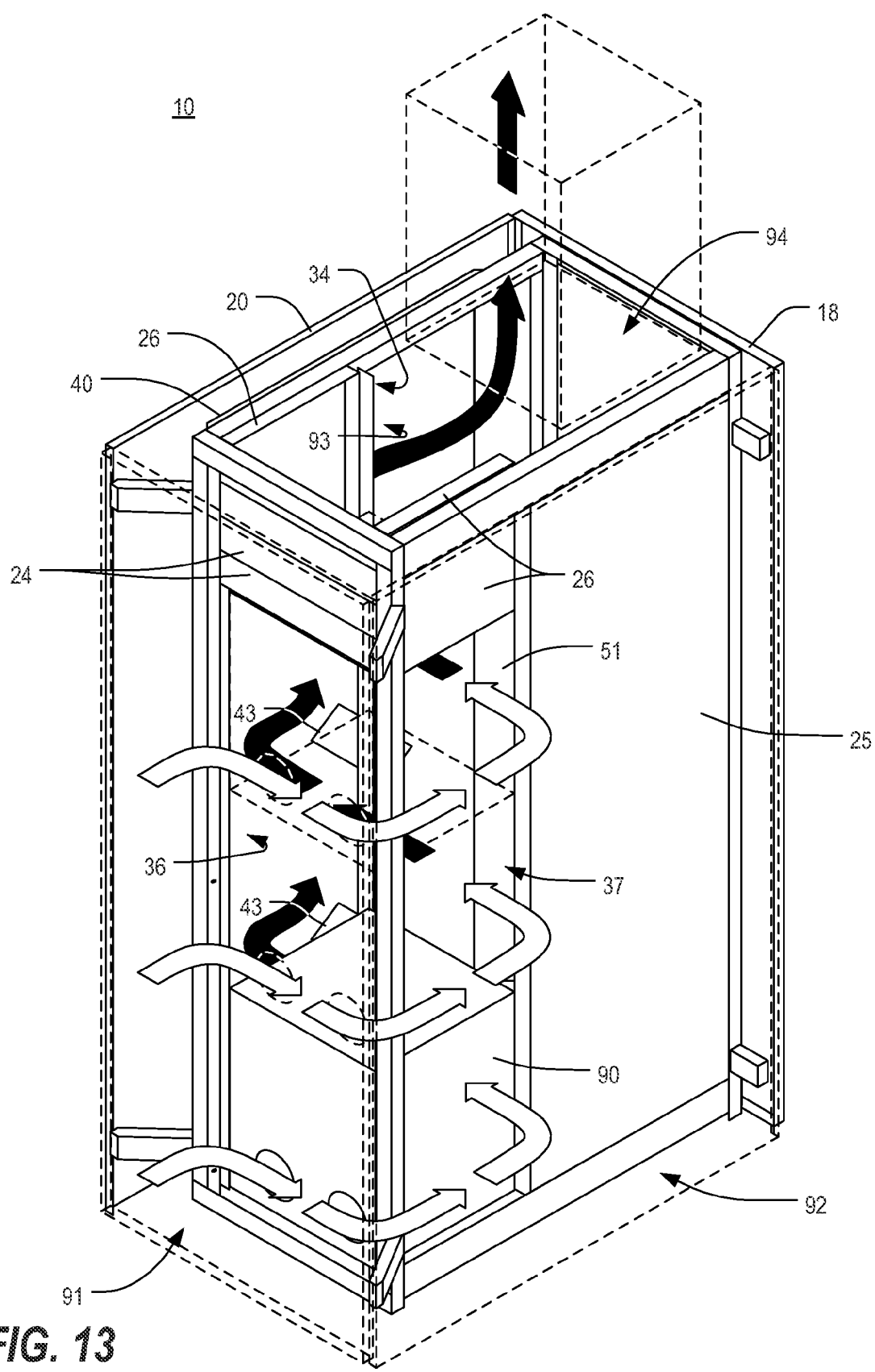
FIG. 13 is an isometric schematic view similar to that of FIG. 11, but with the location of two of the servers shown in broken lines.

FIG. 12 is a top cross-sectional schematic view of the enclosure system 10 of FIG. 11, taken along line 12-12, and FIG. 13 is an isometric schematic view similar to that of FIG. 11, but with the location of two of the servers 90 shown in broken lines. As shown therein, cooling air (represented in FIGS. 12 and 13 by large white arrows) is first routed through the front of the enclosure and into the front plenum 91. This may be accomplished via vents or other openings in the front panel 16, by opening a front door (where the front panel 16 includes one or more doors) or by removing the front panel 16. The cooling air is then routed through the side wall opening 37 and into the intakes of the servers 90. Exiting the servers 90, the heated exhaust air (represented in FIGS. 12 and 13 by large black arrows) is routed through the manifold inlet opening 36, through the manifold 40 (being redirected upward by the spacers 43), and out through the exhaust opening 34 into the rear plenum 94. From the rear plenum 94, the heated exhaust air is routed up and out of the enclosure through the vertical exhaust duct 15.

Installation of a magnetic filler panel 24,124 is accomplished merely by positioning the panel 24,124 such that the ends thereof are placed in close proximity with the vertical members 27 such that a magnetic bond is created between the magnetic strips or regions 32,132 and the vertical members 27. This bond provides a tight air seal between the ends of the filler panels 24,124 and the vertical members 27. Each panel 24,124 may be easily repositioned as necessary or desired, either by removing the panel 24,124 entirely or by sliding the panel 24,124 along the vertical members 27. Indexing features may further facilitate easy installation. Notably, no tools are required for such installation, and considerable time savings may be achieved accordingly. Further, because apertures need not be created through the panel bodies 30,130, the panels 24,124 may be easier to manufacture. Still further, the use of magnetic strips allows for a more modular manufacturing process that can be made to produce many panel sizes without the need for a large tooling investment.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. An electronic equipment enclosure system comprising:
   an enclosure having a frame structure and one or more enclosure panels mounted on the frame structure;
   a duct disposed within the enclosure and having an air inlet opening formed therein for receipt of exhaust air from equipment mounted in an interior of the enclosure; and
   one or more magnetic filler panels for blocking portions of the air inlet opening, thereby preventing the exhaust air from re-entering the interior of the enclosure.

2. The electronic equipment enclosure system of claim 1, wherein at least one of the one or more magnetic filler panels includes an elongated panel body and at least one magnetic region.

3. The electronic equipment enclosure system of claim 2, wherein the at least one magnetic region facilitates direct magnetic attachment of the magnetic filler panel to a mounting member of the enclosure.

4. The electronic equipment enclosure system of claim 3, wherein the mounting member is a vertical mounting rail.

5. The electronic equipment enclosure system of claim 3, wherein the mounting member is a vertical upright of the frame structure.

6. The electronic equipment enclosure system of claim 2, wherein the panel body has a height measured in rack mounting units.

7. The electronic equipment enclosure system of claim 6, wherein the at least one magnetic region has a height that extends the full height of the panel body.

8. The electronic equipment enclosure system of claim 6, wherein the at least one magnetic region has a height that is less than the full height of the panel body.

9. The electronic equipment enclosure system of claim 2, wherein the at least one magnetic region is located at an end of the panel body.

10. The electronic equipment enclosure system of claim 2, wherein the at least one magnetic region includes a separate magnetic strip attached to the panel body.

11. The electronic equipment enclosure system of claim 2, wherein the at least one magnetic region is integral with the panel body.

12. An electronic equipment enclosure system comprising:
an enclosure having a frame structure and one or more enclosure panels mounted on the frame structure;
a side-to-side airflow control system, including:
a side wall adjacent one side of the enclosure, and
a manifold, disposed adjacent the other side of the enclosure, and having an inlet opening and an exhaust opening;
electronic equipment disposed between the side wall and the manifold; and
one or more magnetic filler panels for blocking portions of the inlet opening of the manifold to define an exhaust airflow path into the manifold;
wherein heated exhaust air from the side of the electronic equipment enters the manifold via the exhaust airflow path, travels through the manifold, and exits the manifold via the exhaust opening into a rear plenum of the enclosure defined in part by the side wall.

13. The electronic equipment enclosure system of claim 12, wherein at least one of the one or more magnetic filler panels includes an elongated panel body and at least one magnetic region.

14. The electronic equipment enclosure system of claim 12, wherein the at least one magnetic region facilitates direct magnetic attachment of the magnetic filler panel to a mounting member of the enclosure.

15. The electronic equipment enclosure system of claim 12, wherein the at least one magnetic region includes a separate magnetic strip attached to the panel body.

16. The electronic equipment enclosure system of claim 12, wherein the at least one magnetic region is integral with the panel body.

17. A magnetic filler panel for use in an electronic equipment enclosure system, comprising:
an elongated panel body having opposite ends; and
a magnetic region located at each end of the panel body;
wherein the magnetic regions facilitate direct magnetic attachment of the panel body to a mounting member of an electronic equipment enclosure to define a partition between a first plenum and a second plenum within the enclosure.

18. The magnetic filler panel of claim 17, wherein the panel body has a height measured in rack mounting units.

19. The magnetic filler panel of claim 17, wherein the at least one magnetic region includes a separate magnetic strip attached to the panel body.

20. The magnetic filler panel of claim 17, wherein the at least one magnetic region is integral with the panel body.

* * * * *